(12) United States Patent
Rumrich et al.

(10) Patent No.: US 11,224,123 B2
(45) Date of Patent: Jan. 11, 2022

(54) CIRCUIT BOARD

(71) Applicant: Vitesco Technologies Germany GmbH, Hannover (DE)

(72) Inventors: Thomas Rumrich, Nuremberg (DE); Markus Heckel, Schwabach (DE); Jürgen Sauerbier, Hannover (DE); Johannes Bock, Hannover (DE); Juergen Hornberger, Nuremberg (DE)

(73) Assignee: Vitesco Technologies Germany GmbH, Hannover (DE)

( * ) Notice: Subject to any disclaimer, the term of this patent is extended or adjusted under 35 U.S.C. 154(b) by 0 days.

(21) Appl. No.: 17/226,389

(22) Filed: Apr. 9, 2021

(65) Prior Publication Data

US 2021/0227686 A1     Jul. 22, 2021

Related U.S. Application Data

(63) Continuation of application No. PCT/EP2019/074269, filed on Sep. 11, 2019.

(30) Foreign Application Priority Data

Oct. 10, 2018    (DE) .................. 102018217349.4

(51) Int. Cl.
| | |
|---|---|
| *H05K 1/02* | (2006.01) |
| *H05K 1/18* | (2006.01) |
| *H05K 1/11* | (2006.01) |
| *H05K 5/00* | (2006.01) |

(52) U.S. Cl.
CPC ......... *H05K 1/0271* (2013.01); *H05K 1/0206* (2013.01); *H05K 1/0259* (2013.01); *H05K 1/0268* (2013.01); *H05K 1/116* (2013.01); *H05K 1/18* (2013.01); *H05K 5/0082* (2013.01);

(Continued)

(58) Field of Classification Search
CPC ............ H05K 1/0201–0212; H05K 1/18–189
See application file for complete search history.

(56) References Cited

U.S. PATENT DOCUMENTS

| | | |
|---|---|---|
| 4,755,417 A | 7/1988 | Detoma |
| 10,206,282 B2 | 2/2019 | Teo |
| 10,861,762 B2 | 12/2020 | Strutt et al. |

(Continued)

FOREIGN PATENT DOCUMENTS

| | | |
|---|---|---|
| DE | 102012112738 A1 | 6/2014 |
| DE | 102016225727 A1 | 6/2018 |

(Continued)

OTHER PUBLICATIONS

International Search Report and Written Opinion dated Dec. 20, 2019 from corresponding International Patent Application No. PCT/EP2019/074269.

*Primary Examiner* — Jeremy C Norris

(57) ABSTRACT

The disclosure provides a circuit board that includes: a carrier element having a number of circuit board layers; a number of electronic components; a number of thermal interfaces; and a number of electrical interfaces. The electronic components are arranged directly on at least one of the surface sides on the carrier element. The opposite surface side of the carrier element is of potential-free design. Additionally, the circuit board with the electronic components is overlaid by a covering material in such a way that the electronic components are mechanically stabilized and the thermal and/or electrical interfaces are free of the covering material.

13 Claims, 2 Drawing Sheets

(52) U.S. Cl.
CPC ............ *H05K 2201/09518* (2013.01); *H05K 2201/09536* (2013.01)

(56) References Cited

U.S. PATENT DOCUMENTS

| | | |
|---|---|---|
| 2006/0127652 A1 | 6/2006 | Kanaya et al. |
| 2015/0359107 A1 | 12/2015 | Steinau et al. |

FOREIGN PATENT DOCUMENTS

| | | |
|---|---|---|
| EP | 0207012 A2 | 12/1986 |
| EP | 2991459 A1 | 3/2016 |
| WO | 2018103950 A1 | 6/2018 |

CIRCUIT BOARD

CROSS-REFERENCE TO RELATED APPLICATIONS

This application claims the benefit of International Application PCT/EP2019/074269, filed Sep. 11, 2019, which claims priority to German Application DE 10 2018 217 349.4, filed Oct. 10, 2018. The disclosures of the above applications are incorporated herein by reference.

TECHNICAL FIELD

The disclosure relates to a circuit board, for example, a circuit board for an electronic component, such as a controller in a vehicle or for an application in the automotive sector for example.

BACKGROUND

Conventional electronic components, e.g. a controller of a motor vehicle for arrangement in an engine compartment, such as a transmission controller for example, are usually arranged on a base plate and surrounded by a housing. In this case, the housing may be of hermetically sealed design. The housing can be, for example, a metal housing through which contact pins are guided to the outside. This creates a connection between an exterior space and an interior space of the electronic component. The contact pins can be electrically conductively connected, for example, to a flexible circuit board or to a leadframe and therefore guided to further functional elements.

SUMMARY

The disclosure provides a circuit board for an electronic component that is improved over the prior art in order to avoid, for example, environmental and electrical interference variables.

The circuit board includes at least one carrier element with a number of circuit board layers, a number of electronic components, a number of thermal interfaces and a number of electrical interfaces. The electronic components are arranged directly on at least one of the surface sides on the carrier element, and the opposite surface side of the carrier element is of potential-free design. The circuit board with the electronic components is overlaid by a covering material in such a way that the electronic components are mechanically stabilized and the thermal and/or electrical interfaces are free of the covering material.

The disclosure provides a housing-free circuit board designed to be robust to electrostatic discharges and to undesired electrical or electromagnetic interference. Furthermore, such a housing-free circuit board is designed to be scratch-resistant. In this case, the covering material forms a protective and supporting layer for the electronic components and the circuit board. The covering material overlays or covers not only subassemblies but also largely the entire circuit board, apart from the interfaces. As an alternative, only individual electronic components, such as power components, can be surrounded by the covering material, where the interfaces are free of the covering material.

The thermal interfaces can be formed, for example, on the surface of the circuit board and are free of covering material. In this case, the thermal interfaces are arranged or formed, for example, on the surface side of the circuit board that faces away from a power component. In addition or as an alternative, these thermal interfaces can be arranged or formed on the surface side that faces the power component. For example, the thermal interfaces can be arranged or formed on the corresponding surface side of the circuit board beneath the power component.

The electrical interfaces may be formed on the inside and are accessible from the outside via cutouts in the circuit board. In this case, electrical interfaces can be designed to be accessible at the surface side and/or from the outside.

In this case, the circuit board does not have a housing and is cost-effective. Therefore, complex housings can be dispensed with.

Furthermore, the circuit board is potential-free at the surface at least on one of the surface sides, for example on the surface side that faces away from the electronic components.

The electrical interfaces are formed internally in and/or on at least one of the circuit board layers and/or as a partial or complete passage line which extends, for example, over one or more circuit board layers. As a result, a short circuit or contact is avoided in the event of possible mechanical damage to the covering material, for example a thermoset material. Furthermore, the internal electrical interfaces are protected against undesired access from the outside. Therefore, in the case of a controller, no electrical signals can be tapped off and/or supplied at the surface. As a result, the control arrangement implemented on the circuit board is protected against data access from the outside, for example, against reprogramming and/or data theft.

The thermal interfaces are designed as potential-free areas, for example as refined, tin-plated, silver-plated or gold-plated, copper areas on one of the surface sides of the circuit board. As a result, it is possible to remove heat from the electronic components in a simple and therefore cost-effective manner.

The covering material is, for example, a thermoset material. The covering material is matched, for example, to the material of the carrier element and/or the coefficient of expansion. In addition, the electronic components and/or the surface sides of the circuit board can be overlaid with a solder resist as a protective layer. In this case, the solder resist is applied to the circuit board beneath the covering material and therefore before the covering material. The covering material can be applied in any desired thickness. In order to allow an adequate supporting function, the covering material is applied with a minimum thickness of 1 mm.

Furthermore, the carrier element can be provided with passage bores (for example so-called backdrill bores or HDI technology) which are provided with copper areas. In other words: The internal surface of the respective passage bore is designed as a metallized passage bore and provided, for example, with copper in order to form thermal and/or electrical interfaces. The metallized passage bores allow vertical interconnect accesses within the circuit board and furthermore better cohesion of the circuit board layers of the circuit board as well as improved dissipation of heat. In this case, the passage bores are provided with recesses, in particular a depth-controlled bore, on the surface side of the circuit board that is opposite the electronic component. In this case, the passage bores have a smaller diameter than the end-side recesses. The recesses are made by way of a depth-controlled bore in such a way that they are at a distance from the last internal conductor layer of the circuit board. The metallization is removed in the region of the recess through the bores. Therefore, electrostatic sinks are provided in a simple manner, as a result of which the circuit board is protected against short circuits on the rear side. In addition, the recesses can be filled with a resin material.

In some example, thermal interfaces on the potential-free surface side are designed as refined, for example silver-plated, gold-plated or tin-plated, copper areas.

Furthermore, at least one heat-removal area can be arranged beneath electronic components with a high thermal output, such as a resistor, a transformer, power converter, battery for example, for example on the underlying surface side of the circuit board and/or in at least one inner circuit board layer. In some examples, bottom- or rear-side areas on the surface sides of the circuit board can be provided as thermal sinks. These electronic components, such as power components, can also be arranged above a plurality of metallized passage bores or vias. Simple and rapid removal of heat from the electronic component in question is possible owing to these inner heat-removal areas and the plurality of metallized passage bores as heat dissipators. The end sides of the metallized passage bores or vias are cut out and free of covering material in the region of the surface sides of the circuit board. In addition, the passage bores or vias can be partially filled with a resin material.

In some examples, at least one test point is arranged in an inner circuit board layer as an electrical interface, where an adjacent inner and/or an adjoining upper circuit board layer are/is cut out in the region of the test point and/or an adjoining surface side of the circuit board is free of covering material. One or more test point opening(s), which allows or allow access to the internal test point, is/are preferably provided on a bottom side of the circuit board. In some examples, the test point is arranged on the conducting layer of the circuit board that is closest to a surface side of the circuit board. This surface side of the circuit board that is closest to a test point is free of covering and/or protective layer material in the region of this test point.

In some examples, the test point is not open to the outside and not freely accessible and therefore closed. For example, a test point opening is closed with a resin material. As an alternative, a circuit board material is arranged between the internal test point and the surface side of the circuit board. The resin material or circuit board material is then removed in the event of a test. This obviates the need for laborious removal of the covering material. For testing purposes, the adjacent or adjoining circuit board layer is then opened or the resin material is removed. For example, the test point is exposed mechanically, for example by drilling or lasering.

For example, the test point is accessible for data access via such a cutout which is open to the outside. For example, such a test point is arranged on a penultimate circuit board layer, such as a last conducting level or layer, and the region above it in the direction of the surface side of the circuit board is free of covering and/or protective layer material. Only the test point is overlaid with a circuit board material and/or a resin material.

The test point is connected, via inner conduction tracks, to electronic components for exchanging electrical signals. This allows access to the electrical signals of the control system of the circuit board in a simple manner, without the covering material and/or the protective layer having to be removed or ablated. For example, the position or location of the respective test point in the X and the Y direction on the upper circuit board layer is cut out through this.

Furthermore, protective areas, which are designed as lightning arrester areas and/or ESD protective areas, can be integrated. For example, protective areas can be arranged on the surface of the circuit board. One of the heat-removal areas can also be designed as a protective area and/or electrical interface.

At least one active element, one power component, one passive element and/or one microprocessor are/is provided as electronic components. In addition, a sensor and/or a plug can be arranged on at least one of the surface sides.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
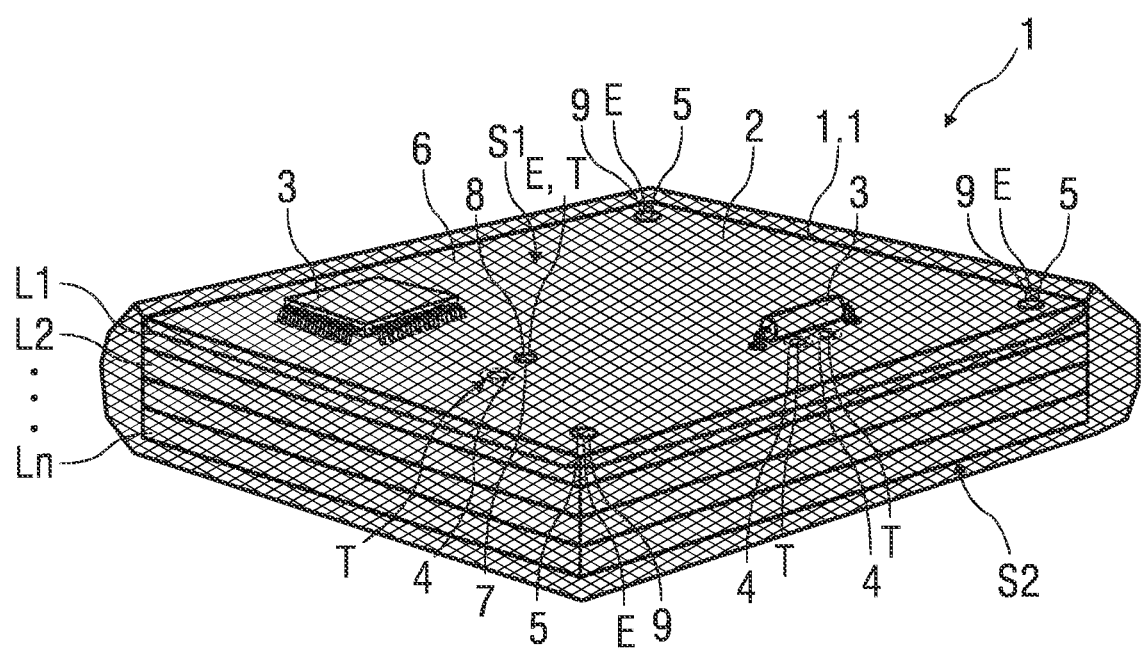
FIG. 1 schematically shows a perspective illustration of a circuit board with an overlaid covering material, FIG. 2 schematically shows a sectional illustration through a circuit board with a covering material overlaid in the region of a power component, and FIG. 3 schematically shows a sectional illustration through a further example of a circuit board with an overlaid covering material.

FIG. 1 schematically shows a perspective illustration of a circuit board 1 which is overlaid with a covering material 2.

Figure 2:
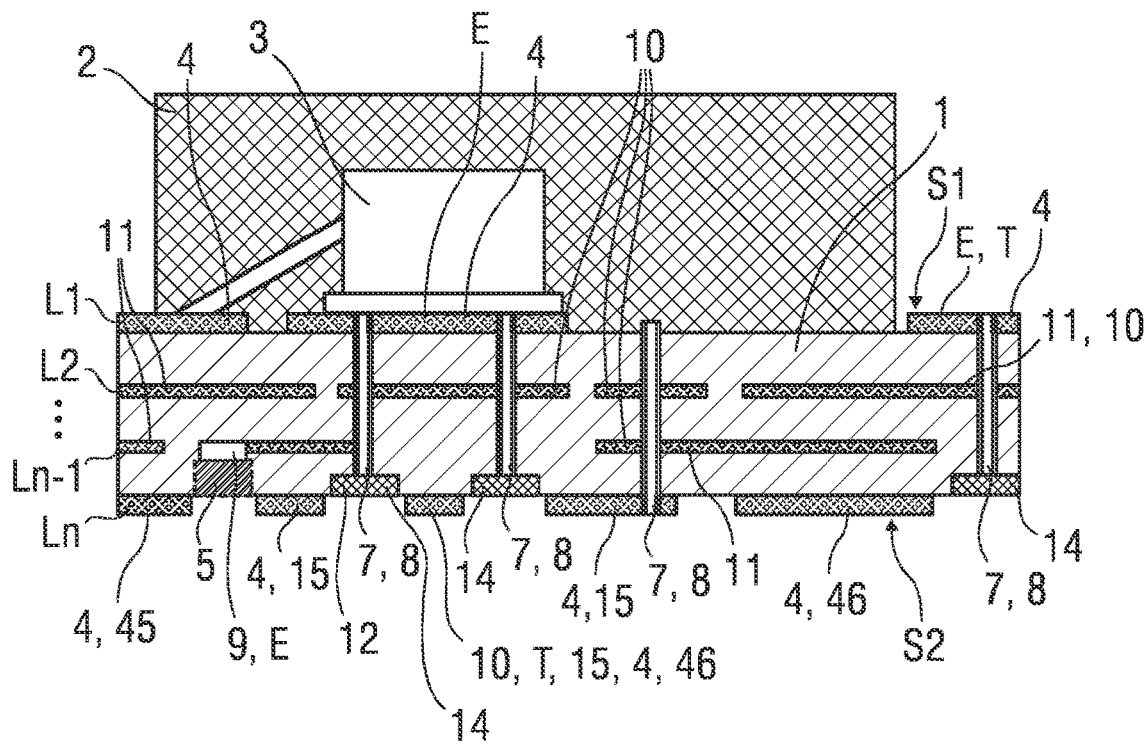

FIG. 2 shows a sectional illustration through an alternative circuit board 1 with a partially applied covering material 2 in the region of a power component.

The circuit board 1 is suitable for an electronic or electromechanical component, for example a controller in aerospace engineering or in the automotive sector, for example in a vehicle.

The circuit board 1 includes at least one carrier element 1.1 with a number of circuit board layers L1 to Ln. Furthermore, the circuit board 1 includes a number of electronic components 3, for example power components, a microprocessor, a capacitor, a resistor, a memory, a transistor, etc.

The carrier element 1.1 is formed, for example, from a substrate material, such as a flame-resistant and flame-retardant composite material, for example composed of an epoxy resin and a woven glass-fiber material, such as FR-4 material (Flame Retardant). The respective circuit board layer L1 to Ln includes conductor tracks, metallized areas, etc.

At least one active element and/or one passive element may be provided as electronic components 3. In addition, a sensor and/or a plug 12 (illustrated in FIG. 3) may be arranged on at least one of the surface sides S1, S2. As an alternative, the plug 12 may also be arranged on the side of the circuit board 1.

Furthermore, a number of thermal interfaces T and/or a number of electrical interfaces E are provided.

The electronic components 3 are arranged, for example, directly on at least one of the surface sides S1 on the carrier element 1.1. In some examples, the electronic components 3 are arranged on the upper surface side S1.

The opposite surface side S2 of the carrier element 1.1 is of potential-free design. For this purpose, the circuit board 1 can be provided with covering material 2. As an alternative, the circuit board 1 can be free of covering material 2 on the lower surface side S2, as illustrated in FIG. 2.

The circuit board 1 with the electronic components 3 is overlaid by the covering material 2 in such a way that the electronic components 3 are mechanically stabilized and the thermal and/or electrical interfaces T and E are free of the covering material 2.

As an alternative, the electronic components 3 can also be arranged on both surface sides S1 and S2.

The covering material 2 therefore forms a protective and supporting layer for the electronic components 3 and partially for the circuit board 1. In this case, the covering material 2 can cover all of the electronic components 3. Free areas of the circuit board 1 can also be covered by the covering material 2. The region in which thermal and/or electrical interfaces E, T are situated is free of covering material 2.

In order to allow better dissipation of heat, the thermal interfaces T, which are formed on the surface of the circuit board 1, are free of the covering material 2. The thermal interfaces T are designed as potential-free areas. For example, the thermal interfaces T are designed as refined copper areas 4 on the surface side or sides S1 or/and S2 of the circuit board 1. As a result, it is possible to remove heat from the electronic components 3 in a simple manner. The thermal interfaces T may be arranged on the surface side S2 and therefore opposite electronic components 3 designed as power components.

In this case, a plurality of thermal interfaces T can be arranged beneath electronic components 3 with a high power and therefore heat output, such as power components. The thermal interfaces can be designed as metallized passage bores 7 with or without refined, for example tin-plated, gold-plated or silver-plated, copper areas 4. Owing to these inner heat-removal areas 10 (shown in FIG. 2) and the plurality of metallized passage bores 7 as heat dissipators, it is possible to remove heat from the electronic component 3 in question in a simple and quick manner. The metallized passage bores 7 extend, for example, over the entire circuit board thickness, for example from a surface side S1, on which the electronic component 3 is arranged, to the opposite surface side S2, which is potential-free. The metallized passage bore 7 is widened and provided, for example, with a depth-controlled counterbore 14 on the surface side S2 opposite the electrical component 3. The metallization is removed in the region of the depth-controlled counterbore 14.

The passage bores 7 can be filled before the application of a mold (the application of the covering material 2), for example filled with a resin in order to control the flow of mold and therefore the distribution of the covering material 2 as it is applied and to increase the service life. The resin is then removed again, so that the circuit board 1 has holes on the surface side S2 in the region of the passage bores 7 with depth-controlled counterbores 14.

The electrical interfaces E are formed on the inside and are accessible from the outside via cutouts 5 in the circuit board 1. The electrical interfaces E, which form a test point 9, can also be closed to the outside. These cutouts 5 can be filled with a material, for example a resin, or be covered by a circuit board material (as is illustrated in FIG. 2 in the sectional illustration for a test point 9). In the event of a test, the regions situated above the electrical interface E of the test point 9 can then be opened, for example lasered or drilled. The electrical interfaces E are free of covering material 2 in the region of the surface side S1 and/or S2 in question. Therefore, for example, in the event of a test, only the circuit board material and/or a resin material has/have to be removed in order to reach the test point 9. This obviates the need for the more laborious removal of the covering material 2, such as a coating material.

The covering material 2 is, for example, a thermoset material.

The circuit board 1 is housing-free on account of being partially or completely overlaid by way of the covering material 2.

Furthermore, the circuit board 1 is potential-free on the surface at least of one of the surface sides S2.

The electronic components 3 and/or the surface sides S1, S2 of the circuit board 1 can optionally be overlaid, for example, with a solder resist as a protective layer 6. In this case, the solder resist is applied beneath the covering material 2 and therefore directly to the circuit board 1 and/or the electronic components 3. The covering material 2 can be applied in any desired thickness.

In some examples, the electrical interfaces E can be designed as passage bores 7. The passage bores 7 are provided, for example, with a metal, such as with copper areas, such as refined, for example tin-plated, gold-plated or silver-plated copper areas and/or copper areas covered with solder resist. In some examples, the internal surface of the respective passage bore 7 is designed as a metallized passage opening and provided, for example, with copper. Such an electrical interface E also allows dissipation of heat and can form a thermal interface T at the same time.

The copper areas of the electrical interfaces E can also be designed as planar areas on the surface side S1 in the region of the electronic components 3, such as beneath these.

In addition, refined copper areas 4, which are designed as lightning arresters or pulse discharge means, can be provided on the lower surface side S2. For example, the refined copper areas 4 are connected to ground. This improves the connection to ground and therefore pulse discharge (ESD/lightning arrester protection).

The metallized passage bores 7 furthermore allow vertical interconnect accesses 8 within the circuit board 1, as are illustrated in FIG. 2. Furthermore, better cohesion of the circuit board layers L1 to Ln and improved dissipation of heat are provided. Furthermore, the metallized passage bores 7 with the non-metallized counterbores 14 allow shielding of the signals in relation to the bottom side of the circuit board 1 in a simple manner.

Lightning arrester protection is provided by the additional flat refined copper areas 4 on the bottom side of the circuit board 1, as a result of which the circuit board 1 is protected against electrostatic discharges (ESD for short).

In some implementations, at least one test point 9 is arranged in or on an inner circuit board layer L2 as an electrical interface E. For example, the test point 9 is arranged on a circuit board layer Ln-1 closest to or adjoining the adjoining, in particular lower, surface side S1. The adjoining lower circuit board layer Ln-1 is cut out in the region of the test point 9. For example, the test point 9 is accessible for data access via an outwardly directed cutout 5. For example, such a test point 9 is arranged on a penultimate or last inner circuit board layer Ln-1.

FIG. 2 schematically shows a sectional illustration through a circuit board 1 with a partially overlaid covering material 2.

FIG. 2 shows passage bores 7 and/or vertical interconnect accesses 8, the ends of which each merge with a depth-controlled counterbore 14 (backdrill bore), which has a larger diameter with a shorter depth than the passage bore 7 in question, in the region of the surface side S2 of the circuit board 1. The depth is selected in such a way that there is a distance from the last inner circuit board layer Ln-1, such as an inner conductor track.

On the surface side S2 of the circuit board 1, the circuit board has a protective area 15, which is designed as a lightning arrester or an ESD sink. This protective area 15 can be connected to ground.

The electrical interfaces E are designed on the outside as refined copper areas 4, on the inside in and/or on at least one of the circuit board layers L1 to Ln and/or as a partial or complete passage line, such as a metallized passage bore 7. The metallized passage bore 7 can extend, for example, over one or more circuit board layers L1 to Ln.

Some of the outer refined copper areas 4 can be designed as tin-plated copper areas 45 and others as tin-plated and potential-free copper areas 46.

Owing to the thickness and parameters, the covering material 2 presents an improvement over enclosed circuit boards. Furthermore, the internal electrical interfaces E are protected against undesired access from the outside. Therefore, in the case of a controller, no electrical signals can be tapped off and/or supplied at the surface. As a result, the control system implemented on the circuit board 1 is protected against data access from the outside.

Furthermore, at least one heat-removal area 10 can be arranged in or on at least one inner circuit board layer L1 beneath the electronic components 3 with a high thermal output.

The test point 9 is connected, via inner conduction tracks 11, to the electronic components 3 for exchanging electrical signals. Owing to the arrangement of the test point 9 as an internal point, the opening of which is closed to the outside, for example, by way of a resin material or circuit board material of a last circuit board layer Ln-1, access to the electrical signals of the control system of the circuit board 1 is possible in a simple manner, for example, by lasering-on the resin material and/or optionally the last circuit board layer Ln-1 instead of removing the covering material 2. In this case, the surface side S2 of the circuit board 1 is free of covering material 2 in the region of the test point 9. This obviates the need for laborious removal of the covering material 2.

In some implementations, thermal interfaces T on the potential-free surface side S2 are designed as refined, for example silver-plated, gold-plated or tin-plated, copper areas 4.

Figure 3:
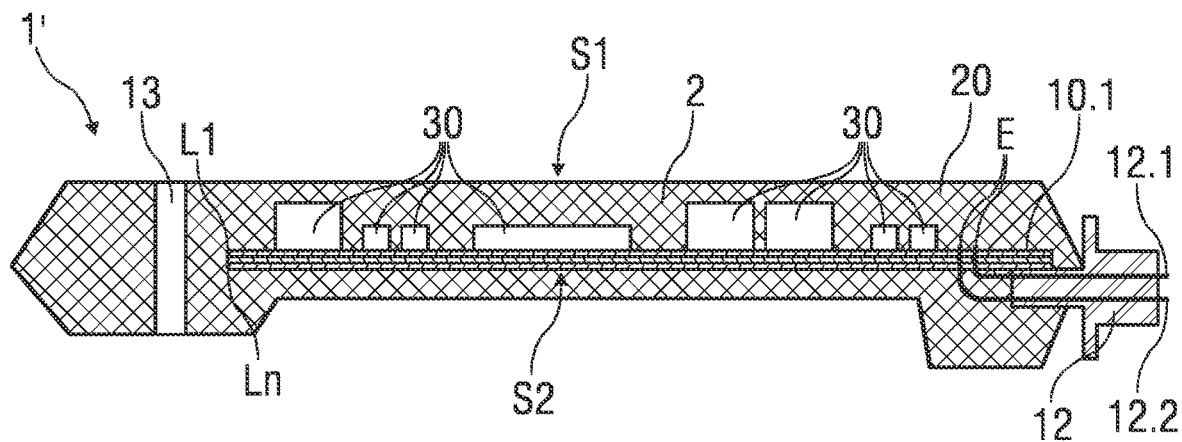

FIG. 3 schematically shows a sectional illustration through a further example of a circuit board 1' with an overlaid covering material 20. The circuit board 1' has a plurality of electronic components 30. In addition, the circuit board 1' has a plug 12 which is at least partially surrounded and supported by the covering material 20. The plug 12 is arranged directly on the carrier element 10.1.

The electronic components 30 are arranged on one surface side S1 of the carrier element 10.1. The plug 12 is arranged, for example, on the opposite surface side S2 of the carrier element 10.1.

Contacts 12.1, 12.2 of the plug 12 are coupled directly to the carrier element 10.1 of the circuit board 1'. For example, the ends of the contacts 12.1, 12.2 that face the carrier element 10.1 are inserted into an electrical interface E of the carrier element 10.1 and fastened.

In addition, the covering material 20 may be provided with a continuous opening 13. The circuit board 1' can be arranged on a housing, not illustrated in any detail, or a wall of a device, for example a motor or transmission unit, by way of this continuous opening 13. The electronic components 30 of the circuit board 1' form, for example, a control unit, for example for an electromechanical transmission or an electric motor, in the interconnected state.

Such a circuit board 1' encased by way of the covering material 20 avoids a housing. The encased circuit board 1' can be easily fastened on the wall or the housing of the device, for example by way of a screw. In other words: The circuit board 1 or 1' can be mounted without a housing directly by way of the casing composed of the covering material 2 or 20, for example can be fastened on a transmission or a motor, in particular on the housing thereof.

A number of implementations have been described. Nevertheless, it will be understood that various modifications may be made without departing from the spirit and scope of the disclosure. Accordingly, other implementations are within the scope of the following claims.

LIST OF REFERENCE SYMBOLS 1, 1' Circuit board
1.1, 10.1 Carrier element
2, 20 Covering material
3, 30 Electronic component
4 Refined copper area
5 Cutout
6 Protective layer
7 Metallized passage bore
8 Vertical interconnect access
9 Test point
10 Heat-removal area
11 Conduction track
12 Plug
12.1, 12.2 Contacts
13 Continuous opening
14 Depth-controlled counterbore
15 Protective area
45 Tin-plated copper area
46 Tin-plated and potential-free copper area
E Electrical interface
L1-Ln Circuit board layer
S1, S2 Surface side of the circuit board
T Thermal interface

What is claimed is:

1. A circuit board, comprising at least:
a carrier element having a number of circuit board layers,
a number of electronic components,
a number of thermal interfaces and
a number of electrical interfaces,
wherein the electronic components are arranged directly on at least one of the surface sides on the carrier element, and
the opposite surface side of the carrier element is of potential-free design, and
wherein the circuit board with the electronic components is overlaid by a covering material in such a way that the electronic components are mechanically stabilized and the thermal and/or electrical interfaces are free of the covering material.

2. The circuit board as claimed in claim 1, wherein the covering material is a thermoset material.

3. The circuit board as claimed in claim 1, wherein the covering material has a thickness of at least 1 mm.

4. The circuit board as claimed in claim 1, wherein the carrier element defines passage bores.

5. The circuit board as claimed in claim 4, wherein the passage bores include metallized passage bores and/or vertical interconnect accesses.

6. The circuit board as claimed in claim 5, wherein the passage bores and/or the vertical interconnect accesses each merge with a depth-controlled counterbore, which has a larger diameter than the passage bore or vertical interconnect access in question, at least at one end in a region of one of the surface sides of the circuit board.

7. The circuit board as claimed in claim 4, wherein at least one of the passage bores is formed at at least one end with a depth-controlled counterbore.

8. The circuit board as claimed in claim 1, wherein the thermal interfaces are designed on a potential-free surface side as refined, tin-plated, gold-plated or silver-plated, copper areas.

9. The circuit board as claimed in claim 1, wherein at least one heat-removal area is arranged in at least one inner circuit board layer beneath electronic components with a high thermal output.

10. The circuit board as claimed in claim 1, wherein at least one test point is arranged in an inner circuit board layer as an electrical interface.

11. The circuit board as claimed in claim 1, wherein at least one active element, one passive element and/or one microprocessor are/is provided as electronic components.

12. The circuit board as claimed in claim 1, wherein a sensor and/or a plug are additionally arranged on at least one of the surface sides.

13. The circuit board as claimed in claim 1, wherein at least one protective area is designed as a lightning arrester and ESD protection in a surface region of the circuit board.

* * * * *